US012652973B2

(12) United States Patent
Mehrotra et al.

(10) Patent No.: US 12,652,973 B2
(45) Date of Patent: Jun. 9, 2026

(54) DELAYED PULSING FOR PLASMA PROCESSING OF WAFERS

(71) Applicant: APPLIED MATERIALS, INC., Santa Clara, CA (US)

(72) Inventors: Akhil Mehrotra, Sunnyvale, CA (US); Vinay Shankar Vidyarthi, San Jose, CA (US); Daksh Agarwal, Sunnyvale, CA (US); Samaneh Sadighi, San Jose, CA (US); Jason Kenney, Santa Clara, CA (US); Rajinder Dhindsa, Pleasanton, CA (US)

(73) Assignee: Applied Materials Inc., Santa Clara, CA (US)

( * ) Notice: Subject to any disclaimer, the term of this patent is extended or adjusted under 35 U.S.C. 154(b) by 435 days.

(21) Appl. No.: 18/378,251

(22) Filed: Oct. 10, 2023

(65) Prior Publication Data

US 2024/0047195 A1 Feb. 8, 2024

Related U.S. Application Data

(62) Division of application No. 16/173,988, filed on Oct. 29, 2018, now Pat. No. 11,817,312.

(51) Int. Cl.
H10P 14/60 (2026.01)
H01J 37/32 (2006.01)
(Continued)

(52) U.S. Cl.
CPC .... H10P 14/6336 (2026.01); H01J 37/32146 (2013.01); H10P 14/6339 (2026.01); H10P 50/242 (2026.01); H10P 50/691 (2026.01); H10P 72/0421 (2026.01); H10P 74/238 (2026.01)

(58) Field of Classification Search
CPC ............ H01J 37/32146; H10P 14/6336; H10P 14/6339; H10P 50/242; H10P 50/691; H10P 72/0421; H10P 72/0441; H10P 72/0462; H10P 72/70; H10P 72/72; H10P 74/238; H01L 21/02274; H01L 21/0228; H01L 21/3065; H01L 21/308; H01L 21/67069; H01L 21/67126; H01L 21/6719; H01L 21/6831; H01L 22/26
See application file for complete search history.

(56) References Cited

U.S. PATENT DOCUMENTS 6,193,855 B1 2/2001 Gopalraja et al.
2003/0181034 A1 9/2003 Jiang et al.
(Continued)

*Primary Examiner* — Benjamin Kendall
(74) *Attorney, Agent, or Firm* — Moser Taboada

(57) ABSTRACT

A method, apparatus and system for processing a wafer in a plasma chamber system, which includes at least a plasma generating element and a biasing electrode, include generating a plasma in the plasma chamber system by applying a source RF source power to the plasma generating element for a first period of time of a pulse period of the RF source power, after the expiration of the first period of time, removing the source RF source power, after a delay after the removal of the RF source power, applying an RF bias signal to the biasing electrode for a second period of time to bias the generated plasma towards the wafer, and after the expiration of the second period of time, removing the RF bias signal from the biasing electrode before a next pulse period of the RF source power. The generated plasma biased toward the wafer is used to process the wafer.

20 Claims, 8 Drawing Sheets

(51) Int. Cl.

| | | |
|---|---|---|
| *H10P 50/00* | | (2026.01) |
| *H10P 50/24* | | (2026.01) |
| *H10P 72/00* | | (2026.01) |
| *H10P 74/00* | | (2026.01) |

(56) References Cited

U.S. PATENT DOCUMENTS

| | | |
|---|---|---|
| 2004/0241984 A1 | 12/2004 | Schwan et al. |
| 2005/0136687 A1 | 6/2005 | Lu et al. |
| 2007/0096108 A1 | 5/2007 | Hohage et al. |
| 2007/0099010 A1 | 5/2007 | Hohage et al. |
| 2017/0103893 A1 | 4/2017 | Kelshreshtha et al. |
| 2018/0115299 A1 | 4/2018 | Nagami et al. |

110

DISPLAY
250

INPUT/OUTPUT CIRCUITRY
240

SUPPORT
CIRCUITRY
230

MEMORY
220

PROGRAM

PROCESSOR
210

400

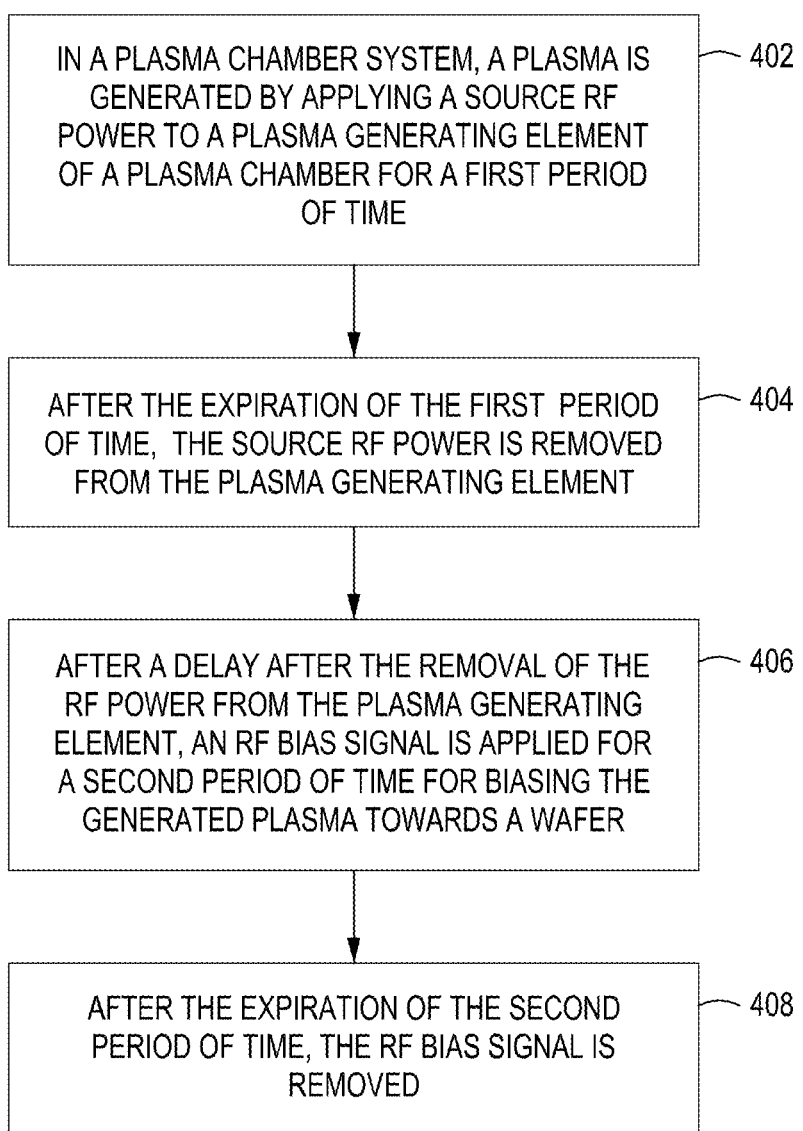

IN A PLASMA CHAMBER SYSTEM, A PLASMA IS GENERATED BY APPLYING A SOURCE RF POWER TO A PLASMA GENERATING ELEMENT OF A PLASMA CHAMBER FOR A FIRST PERIOD OF TIME ~ 402

AFTER THE EXPIRATION OF THE FIRST PERIOD OF TIME, THE SOURCE RF POWER IS REMOVED FROM THE PLASMA GENERATING ELEMENT ~ 404

AFTER A DELAY AFTER THE REMOVAL OF THE RF POWER FROM THE PLASMA GENERATING ELEMENT, AN RF BIAS SIGNAL IS APPLIED FOR A SECOND PERIOD OF TIME FOR BIASING THE GENERATED PLASMA TOWARDS A WAFER ~ 406

AFTER THE EXPIRATION OF THE SECOND PERIOD OF TIME, THE RF BIAS SIGNAL IS REMOVED ~ 408

FIG. 4

DELAYED PULSING FOR PLASMA PROCESSING OF WAFERS

CROSS-REFERENCE TO RELATED APPLICATIONS

This application claims benefit of and priority to U.S. patent application Ser. No. 16/173,988 filed Oct. 29, 2018, which is herein incorporated by reference in its entirety.

FIELD

Embodiments of the present principles generally relate to plasma processing and more specifically to delayed pulsing between source and bias RF power for plasma processing of wafers.

BACKGROUND

Many modern semiconductor chip fabrication processes include generation of a plasma from which ions and/or radical constituents are derived for use in either directly or indirectly affecting a change on a surface of a substrate exposed to the plasma. For example, various plasma-based processes can be used to etch material from a substrate surface, deposit material onto a substrate surface, or modify a material already present on a substrate surface. The plasma is often generated by applying radiofrequency (RF) power to a process gas in a controlled environment, such that the process gas becomes energized and transforms into the desired plasma. The characteristics of the plasma and resulting etch or deposition processes are affected by many process parameters including, but not limited to, a frequency, duty cycle, and magnitude of the RF power applied, and a bias voltage applied to attract charged constituents of the plasma toward the substrate.

As the film thickness and device dimensions decrease in semiconductor chip fabrication processes, etch selectivity and uniformity become increasingly significant. Selectivity is defined as the ability to etch one layer faster than another layer under the same etching conditions whereas uniformity refers to the ability of the process to evenly remove the desired layer. Etch selectivity is of particular interest when, for example, a device requires selective removal of different layers to obtain desired shapes or high aspect ratio etch is required, which needs consuming top mask material significantly less than the bottom material. Apart from selectivity, etching rates and profiles depend on feature size. Problems in achieving microscopic uniformity (similar depth for different profiles/shapes) arise often as most etch processes produce aspect ratio-dependent etch (ARDE). In ARDE, rate of material removal is dependent upon the aspect ratio of the opening, which is defined as the ratio of the depth of the opening to the diameter/area of the opening. As such, features with a high aspect ratio etch more slowly than features with a smaller aspect ratio or bigger hole size. In deposition case, generally deposition rate in high aspect ratio is slower than deposition in larger holes. Thus, the etching rate/deposition rate decreases as the feature dimensions are reduced. Current semiconductor fabrication requires multiple features size present within a die to be etched until a same depth simultaneously. In such instances, an ARDE effect inherently present during any plasma etch has to be controlled. Also shrinking devices requires higher selectivity etch since top mask material is made smaller with the shrinking size. Etching in nanometer scale also needs precision etch with atomic level etch accuracy. Hence atomic layer etch is also a desired feature during etch which enables layer by layer atomic removal of desired material. The atomic layer etching could reduce ARDE and give very high selectivity. Such effect is sometimes referred to as loading.

SUMMARY

Embodiments of methods, apparatuses and systems for processing a wafer in a plasma chamber system using delayed pulsing are disclosed herein.

In some embodiments a method in a plasma chamber system for processing a wafer, includes generating a plasma by applying RF source power to a plasma generating element of the plasma chamber for a first period of time of a pulse period of the RF source power, after the expiration of the first period of time, removing the RF source power from the plasma generating element, after a delay after the removal of the RF source power from the plasma generating element, applying an RF bias signal to bias the generated plasma towards the wafer for a second period of time during the pulse period of the RF source power, after the expiration of the second period of time, removing the RF bias signal before a next pulse period of the RF source power.

In some embodiments, an apparatus for controlling a processing of a wafer, includes a processor and a memory coupled to the processor, the memory having stored therein at least one of programs or instructions executable by the processor. Upon execution of the programs or instructions, the apparatus is configured to generate a plasma by applying RF source power from the RF source power source to the plasma generating element of the plasma chamber for a first period of time of a pulse period of the RF source power, after the expiration of the first period of time, remove the RF source power from the plasma generating element, after a delay after the removal of the RF source power from the plasma generating element, apply an RF bias signal from the RF bias signal source to the biasing electrode for a second period of time during the pulse period of the RF source power to bias the generated plasma towards the wafer, and after the expiration of the second period of time, remove the RF bias signal from the biasing electrode before a next pulse period of the RF source power.

In some embodiments, a system for processing a wafer includes a plasma chamber system including a plasma generating element and a biasing electrode, an RF source power source, an RF bias signal source, and a controller including a processor and a memory coupled to the processor, the memory having stored therein at least one of programs or instructions executable by the processor. Upon execution of the programs or instructions, the controller is configured to generate a plasma by applying RF source power from the RF source power source to the plasma generating element of the plasma chamber for a first period of time of a pulse period of the RF source power, after the expiration of the first period of time, remove the RF source power from the plasma generating element, after a delay after the removal of the RF source power from the plasma generating element, apply an RF bias signal from the RF bias signal source to the biasing electrode for a second period of time during the pulse period of the RF source power to bias the generated plasma towards the wafer, and after the expiration of the second period of time, remove the RF bias signal from the biasing electrode before a next pulse period of the RF source power.

In some embodiments, a non-transitory computer-readable medium/storage device includes, stored thereon, at least one program, the at least one program including instructions which, when executed by a processor, cause the processor to perform a method in a plasma chamber system for processing a wafer. Upon execution of the programs or instructions, the processor is configured to generate a plasma by applying RF source power to a plasma generating element of the plasma chamber for a first period of time of a pulse period of the RF source power, after an expiration of the first period of time, remove the RF source power from the plasma generating element, after a delay after the removal of the RF source power from the plasma generating element, apply an RF bias signal to bias the generated plasma towards the wafer for a second period of time during the pulse period of the RF source power, and after an expiration of the second period of time, remove the RF bias signal before a next pulse period of the RF source power.

Other and further embodiments of the present principles are described below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the present principles and are therefore not to be considered limiting of scope, for the present principles may admit to other equally effective embodiments.

For example.

FIG. 4 depicts a flow diagram of a method for processing a wafer in accordance with an embodiment of the present principles.

Figure 1:
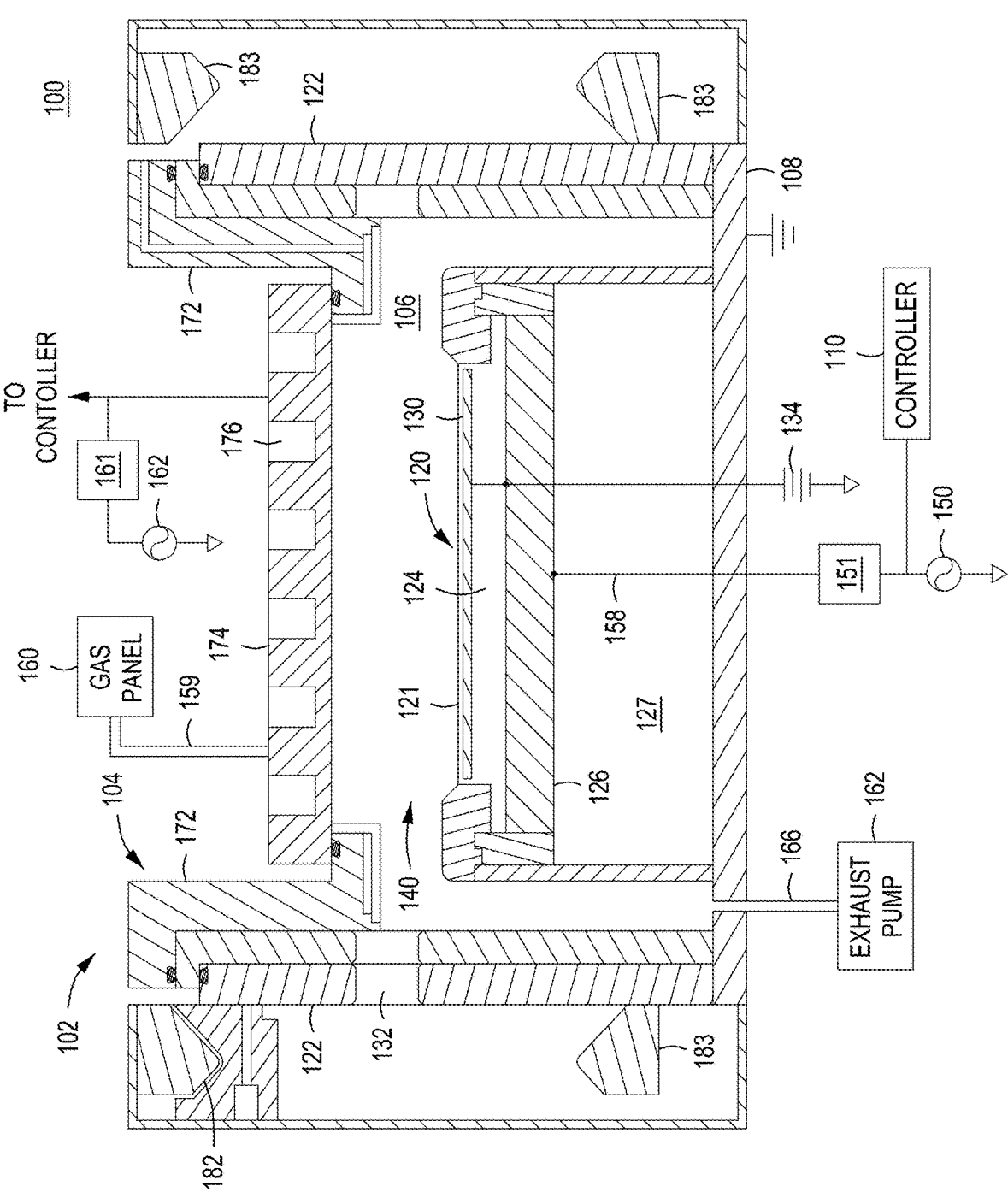
FIG. 1 depicts a cross sectional view of an embodiment of a plasma chamber system in which embodiments of the present principles can be applied.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

In the following description, numerous specific details are set forth in order to provide a thorough understanding of exemplary embodiments or other examples described herein. However, these embodiments and examples may be practiced without the specific details. In other instances, well-known methods, procedures, components, and/or circuits have not been described in detail, so as not to obscure the following description. Further, the embodiments disclosed are for exemplary purposes only and other embodiments may be employed in lieu of, or in combination with, the embodiments disclosed. For example, although embodiments of the present principles are described with respect to a specific plasma processing system and corresponding components and wafers, embodiments in accordance with the present principles can be implemented in other hardware devices capable of processing devices, such as substrates and wafers and other processing objects.

In accordance with embodiments of the present principles on and off times of a pulsed RF power source(s) used for generating a plasma in a plasma processing system are controlled along with the on and off times of a pulsed RF bias power source, which generates plasma near a wafer such that a neutral density to ion density ratio of the generated plasma and energy of those ions can be controlled independently. The generated plasma can then be used to process (e.g., etch) a wafer/substrate in the plasma processing system using a selected neutral to ion density ratio with a desired independent ion energy, to produce a desired effect on, for example, the surface of the wafer. In some embodiments in accordance with the present principles, the desired effect can include at least one or more of a loading improvement or ARDE reduction, and improving etching selectivity between different materials on the surface of the wafer.

FIG. 1 depicts a cross sectional view of an embodiment of a plasma chamber system 100 in which embodiments of the present principles can be applied. The plasma chamber system 100 generally comprises a chamber body 102 and a lid assembly 104 that defines an evacuable chamber 106 for performing substrate processing. In one embodiment, the plasma chamber system 100 is an etch system available from Applied Materials, Inc. of Santa Clara, Calif. Such systems can include processing systems such as an Inductively Coupled Plasma (ICP) reactor, a capacitively coupled plasma (CCP) reactor, and the like, which are also available from Applied Materials, Inc. of Santa Clara, Calif.

Referring back to FIG. 1, the plasma chamber system 100 comprises a gas panel 160 coupled to the chamber 106 via a plurality of gas lines 159 for providing processing gases, an exhaust stack 164 coupled to the chamber 106 via an exhaust passage 166 for maintaining a vacuum environment and exhausting undesirable gases and contaminants. Additionally, a controller 110 is coupled to the various components of the system 100 to facilitate control of the processes (e.g., deposition and etching processes) within the chamber 106.

The chamber body 102 includes at least one of sidewall 122 and a chamber bottom 108. At least one sidewall 122 can be electrically grounded. The chamber body 102 can be fabricated from a non-magnetic metal, such as anodized aluminum, and the like. The chamber body 102 contains a substrate entry port 132 that is selectively sealed by a slit valve (not shown) disposed in the processing platform.

A lid assembly 104 is disposed over the sidewalls 122 and defines a processing region 140 within the chamber 106. The lid assembly 104 generally includes a lid 172 and a plasma generating element (e.g., source or anode electrode) 174 mounted to the bottom of the lid 172. The plasma generating element 174 is coupled to a RF power source 162 via a matching network 161. The power source 162 provides RF source power used to ignite and maintain a plasma from a gas mixture in the chamber 106.

A substrate support pedestal 120 is disposed within the chamber 106 and seated on the chamber bottom 108. A substrate (i.e., wafer, not shown) undergoing wafer processing is secured on an upper surface 121 of the substrate support pedestal 120. The substrate support 120 can be a susceptor, a heater, ceramic body, or electrostatic chuck on which the substrate is placed during processing. The substrate support pedestal 120 is adapted to receive an RF bias signal, such that the substrate support pedestal serves as a biasing element (e.g., cathode electrode) with respect to the RF bias signal, as is discussed below in further detail.

The electrostatic chuck 124 can be provided with one or more chucking electrodes 130. The electrodes 130 can be disposed relatively close to the top surface of the electrostatic chuck 124. In such a manner, the chucking electrodes 130 provide the necessary electrostatic force to the backside of a wafer to retain (i.e., chuck) the wafer on the electrostatic chuck 124. The chucking electrodes 130 are connected to a remote power source, i.e. a high voltage DC (HVDC) power supply 134, which provides a chucking voltage sufficient to secure the wafer to the chuck 124. A cooling plate 126 assists in regulating the temperature of the electrostatic chuck 124.

As discussed above, the substrate support pedestal 120 also serves as a biasing electrode (e.g., cathode) for biasing the ionized gases towards the wafer during either a deposition or etching process. A bias power supply 150 is positioned between the substrate support pedestal 120 and ground via a matching network 151. In one embodiment, the grounded sidewalls 122 and the plasma generating element 174 together define the anode with respect to the biasing element (cathode) in the substrate support pedestal 120.

The controller 110 can be utilized to control the bias power supply 150 and the RF power source 162. In particular, the controller 110 controls the power set points and the ON-OFF timing of the bias power supply 150 and the RF power source 162 to provide substantially on or off conditions and any condition in between. That is, the controller 110 can be used to control the RF bias signal provided by the bias power supply 150 and the RF signal from the source RF power source 162 to perform at least the embodiments of the present principles described herein.

Figure 2:
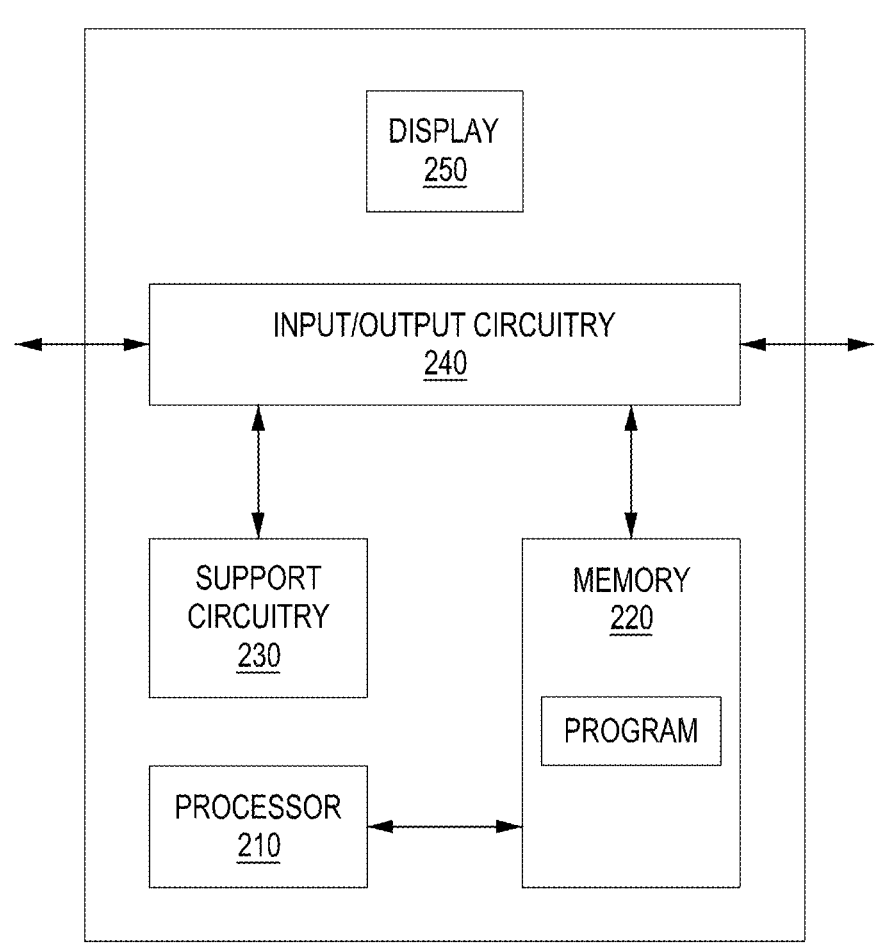
FIG. 2 depicts a high level block diagram of a controller in accordance with an embodiment of the present principles.

FIG. 2 depicts a high level block diagram of a controller 110 of FIG. 1 in accordance with an embodiment of the present principles. The controller 110 of FIG. 2 illustratively comprises a processor 210, which can include one or more central processing units (CPU), as well as a memory 220 for storing control programs, configuration information, backup data and the like. The processor 210 cooperates with support circuitry 230 such as power supplies, clock circuits, cache memory and the like as well as circuits that assist in executing the software routines/programs stored in the memory 220. As such, some of the process steps discussed herein as software processes may be implemented within hardware, for example, as circuitry that cooperates with the processor 210 to perform various steps. The controller 110 also contains an input-output circuitry and interface 240 that forms an interface between the various functional elements communicating with the controller 110. For example, in some embodiments the input-output circuitry and interface 240 can include or be connected to an optional display 250, a keyboard and/or other user input (not shown). The input-output circuitry and interface 240 can be implemented as a user interface for interaction with the controller 110.

The controller 110 can communicate with other computing devices based on various computer communication protocols such a Wi-Fi, Bluetooth® (and/or other standards for exchanging data over short distances includes protocols using short-wavelength radio transmissions), USB, Ethernet, cellular, an ultrasonic local area communication protocol, etc. The controller 110 can further include a web browser.

Although the controller 110 of FIG. 2 is depicted as a general purpose computer, the controller 110 is programmed to perform various specialized control functions and is configured to act as a specialized, specific computer in accordance with the present principles, and embodiments can be implemented in hardware, for example, as an application specified integrated circuit (ASIC). As such, the process steps described herein are intended to be broadly interpreted as being equivalently performed by software, hardware, or a combination thereof.

In, for example, etching processes, neutral density to ion density ratio and ion energies of a created plasma are particularly important. For example, CCP etching processes generally possess higher ion energies in a created plasma and as such are typically used for implementations in which deeper etching is required. In contrast, ICP etching processes have lower ion energies in a created plasma but have higher neutral densities and as such are used for implementations which require higher etch rates. Pulsed, sync etching processes provide relatively higher neutral densities and ion energies in a created plasma than possible during Continuous power ON mode, however, require that a source (plasma) power and bias power are on at the same time for a fixed time period and also be Off together as well.

In accordance with the present principles, the inventors have determined that by providing a delay between a time a source power applied to a plasma generating element for generating a plasma is turned off and a time that a bias power is applied for biasing the generated plasma towards a wafer is turned on, a neutral density to ion density ratio of a created plasma can be controlled to, for example, have increased neutral density. The inventors further determined that plasma ion energy can be controlled independent of plasma ion density, for example to have low ion density with high ion energy. The increased neutral density of a plasma created in accordance with the present principles can result in an improvement of a typical loading deficiency that occurs in an etch process using conventionally created plasmas and can gain higher selectivity than possible in conventional approaches.

Figure 3A:
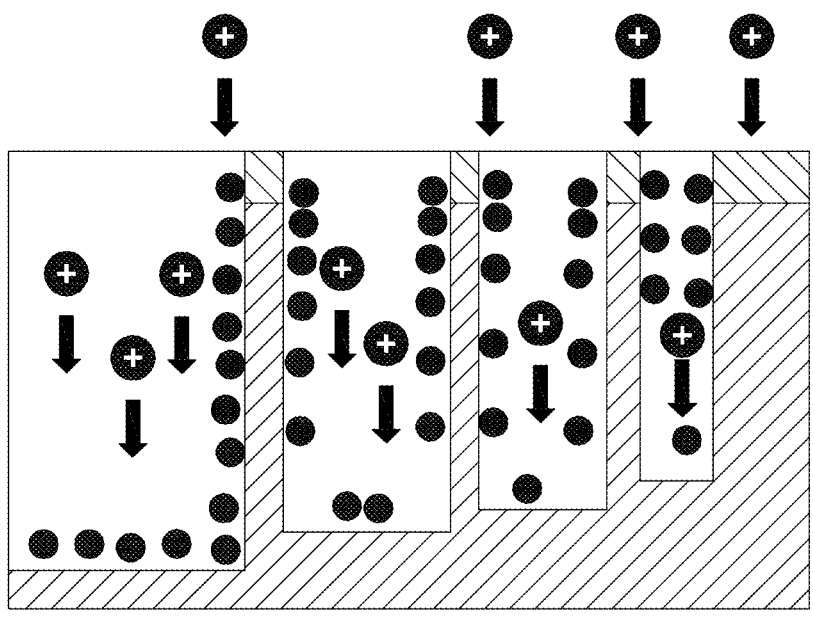
FIG. 3a depicts a pictorial representation of a surface of a wafer having been etched using a conventional etching processes.

For example, FIG. 3a depicts a pictorial representation of a surface of a wafer having been etched using any of the conventional etching processes (e.g. ICP, CCP, Pulsed, sync processes, source ON and bias ON pulsing without time delay) in which a source power and a bias power are applied simultaneously. As depicted in FIG. 3a, in etching systems in which a source power and a bias power are on simultaneously, a resulting neutral density to ion density ratio of a created plasma results in the non-uniform etching of wafer surface features having different etch rates for different aspect ratios. More specifically, as depicted in FIG. 3a, wafer surface features having larger aspect ratios are etched more deeply by a plasma created using conventional plasma generation and application processes as compared with wafer surface features having smaller aspect ratios because a greater number of neutrals are able to enter the surface features having greater aspect ratios. In addition, within small features, neutral densities decay faster than ion decay, so smaller features have very low neutral density reaching the bottom of the etch surface.

Figure 3B:
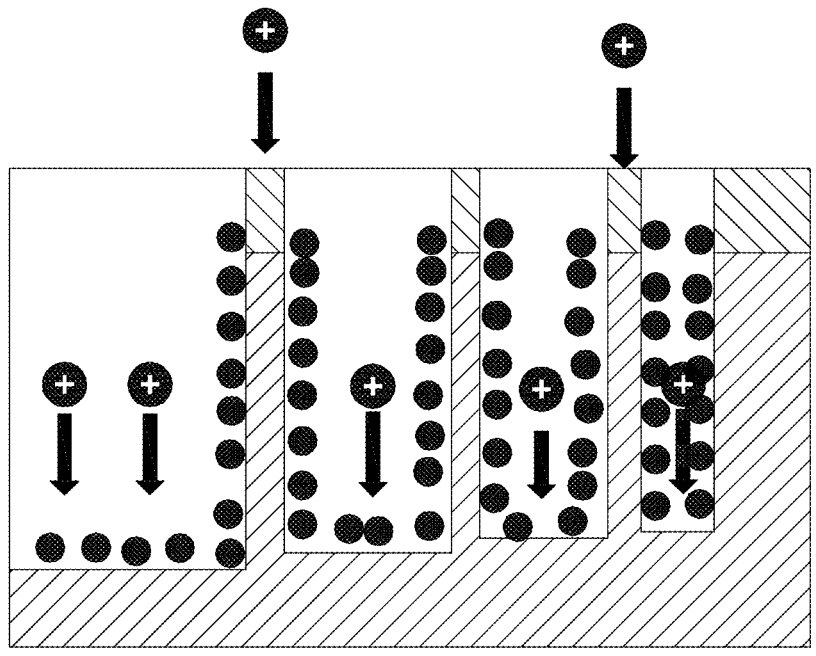
FIG. 3b depicts a pictorial representation of a surface of a wafer having been etched using a plasma generated in accordance with an embodiment of the present principles.

FIG. 3b depicts a pictorial representation of a surface of a wafer having been etched using a plasma created and applied in accordance with an embodiment of the present principles. As depicted in FIG. 3b, in etching systems in which a plasma is created and applied in accordance with embodiments of the present principles, a resulting neutral density to ion density ratio of a created plasma results in a more uniform etching of wafer surface features having different aspect ratios. More specifically, as depicted in FIG. 3b, providing a delay between the beginning of an "off time" of an RF source power provided for generating a plasma and the beginning of an "on time" for the RF bias signal provided for biasing the ionized, generated plasma towards the wafer in accordance with the present principles, provides a higher neutral density to ion density ratio for a generated plasma. As a result of the higher neutral density to ion density ratio for the generated plasma, the features on a surface of the wafer having large aspect ratios are etched at substantially the same depth as compared with wafer surface features having smaller aspect ratios because a greater number of neutrals are available compared to ions in the generated plasma.

FIG. 4 depicts a flow diagram of a method 400 for processing a wafer in accordance with an embodiment of the present principles. The method 400 of FIG. 4 can begin at 402 during which, in a plasma chamber system, such as the plasma chamber system 100 of FIG. 1, an RF source power pulse from the RF power source 162 is provided, for example, via the matching network 161, to the plasma generating element 174 for a first period of time (i.e., duty cycle/on time of the RF source power pulse) within a pulse period to ignite and maintain a plasma, for example, from a gas mixture in the chamber 106. In some embodiments in accordance with the present principles, a duty cycle of a pulse from the RF power source can be between 2% to 98% and a large range of pulse periods can be used, such as between 1 sec to 1 microsec. In some embodiments, an RF source power pulse with a low duty cycle is provided to enable delaying an RF bias signal pulse enough within a pulse period of the RF bias signal pulse to provide a desired, large neutral density to ion density ratio in a generated plasma. In other embodiments, a duty cycle of the RF source power pulse can be altered in real time to produce a desired neutral density to ion density ratio in a generated plasma. The method 400 can proceed to 404.

At 404, after the expiration of the first period of time, for example after the duty cycle of the RF source power pulse, the RF source power from the RF power source 162 is removed/no longer applied to the plasma generating element 174. In some embodiments in accordance with the present principles, the RF power source 162 can be turned off to cease the application of the RF source power from the RF power source 162. In alternate embodiments, a blocking means, such as a switch or a circuit (not shown), can be provided to prevent the application of the RF source power from the RF power source 162 to the plasma generating element 174 or from the plasma generating element 174 to a surface of the wafer for a time period during which the RF source power is desired to be off. The method 400 can proceed to 406.

At 406, after a delay after the removal of the RF source power from the plasma generating element 174 (i.e., off time of the RF source power), an RF bias signal pulse provided by the bias power supply 150 is applied to, for example, the support pedestal 120, for biasing the ionized, generated plasma towards a wafer for a second period of time (i.e., a duty cycle/on time of the bias signal pulse). The generated plasma biased toward the wafer is then used to process the wafer. In some embodiments in accordance with the present principles, the delay can be between 1 microsec to 1 second. In other embodiments, the delay can be close to zero as long as the RF source power is declining as the RF bias signal is turned on or increasing. In accordance with embodiments of the present principles, a duty cycle of the bias signal pulse is controlled to produce a desired etching effect on a surface of a wafer. For example, in some embodiments, a duty cycle of the bias signal pulse is different than a duty cycle of the RF source power pulse. In other embodiments, a duty cycle of the bias signal pulse can be the same as a duty cycle of the RF source power pulse or can be altered in real time to produce a desired etching effect. The method 400 can proceed to 408.

At 408, after the expiration of the second period of time, for example after the duty cycle of the RF bias signal pulse, the RF bias signal from the bias power supply 150 is removed/no longer applied to the support pedestal 120. In some embodiments in accordance with the present principles, the bias power supply 150 can be turned off to cease the application of the RF bias signal from the bias power supply 150 to the support pedestal 120. In alternate embodiments, a blocking means, such as a switch or a circuit (not shown), can be provided to prevent the application of the RF bias signal from the bias power supply 150 to the support pedestal 120 for a time period during which the RF bias signal is desired to be off. In embodiments in accordance with the present principles, the second time period during which the RF bias signal is applied for biasing the ionized, generated plasma towards a wafer cannot be greater than the time period between the removal of the RF source power from the plasma generating element 174 and the end of the pulse period of the RF source power. That is, the RF bias signal from the bias power supply 150 is removed before a subsequent pulse period of the RF source power begins. The method 400 can then be exited.

In embodiments in accordance with the present principles, the pulse periods (e.g., on and off times) and amplitudes of the RF source power from the source RF power source 162 and the RF bias signal from the bias power supply 150 are dependent on the type of process being performed and the plasma process chamber being implemented to perform the process on a wafer. For example, in one etching embodiment in which Argon is used as the plasma material, an RF source power for generating plasma can have a power of 2000 W with a duty cycle of 20% and a bias signal of 100 W with a duty cycle of 20%.

Figure 5A:
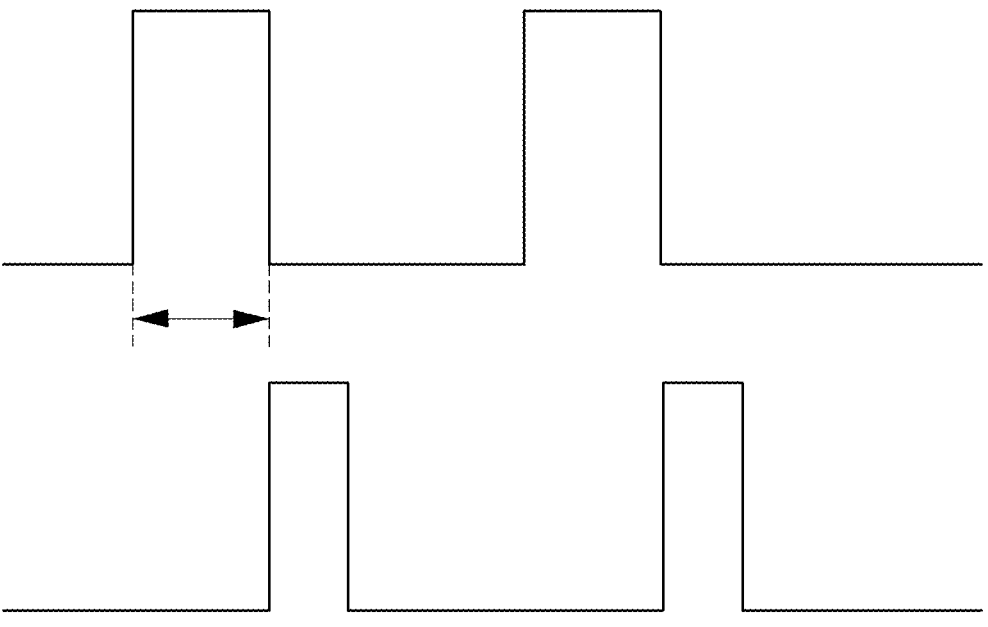
FIG. 5a depicts a graphical representation of a first delay between the end of the pulse of an RF source power signal and the start of a pulse of the RF bias signal in accordance with an embodiment of the present principles.
Figure 5B:
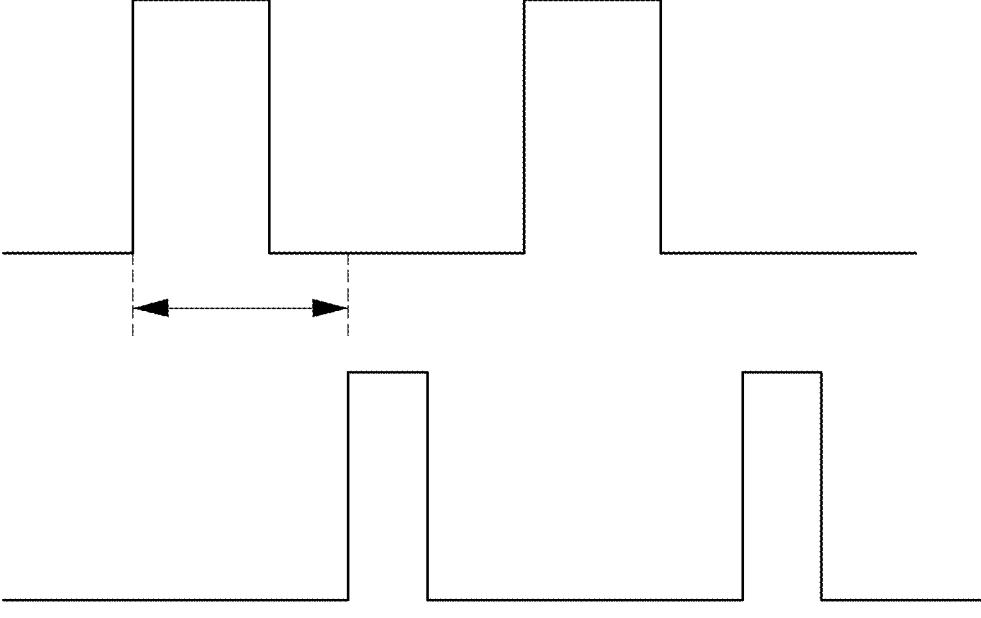
FIG. 5b depicts a graphical representation of a second delay between the end of the pulse of a RF source power signal and the start of a pulse of the RF bias signal in accordance with an embodiment of the present principles.
Figure 5C:
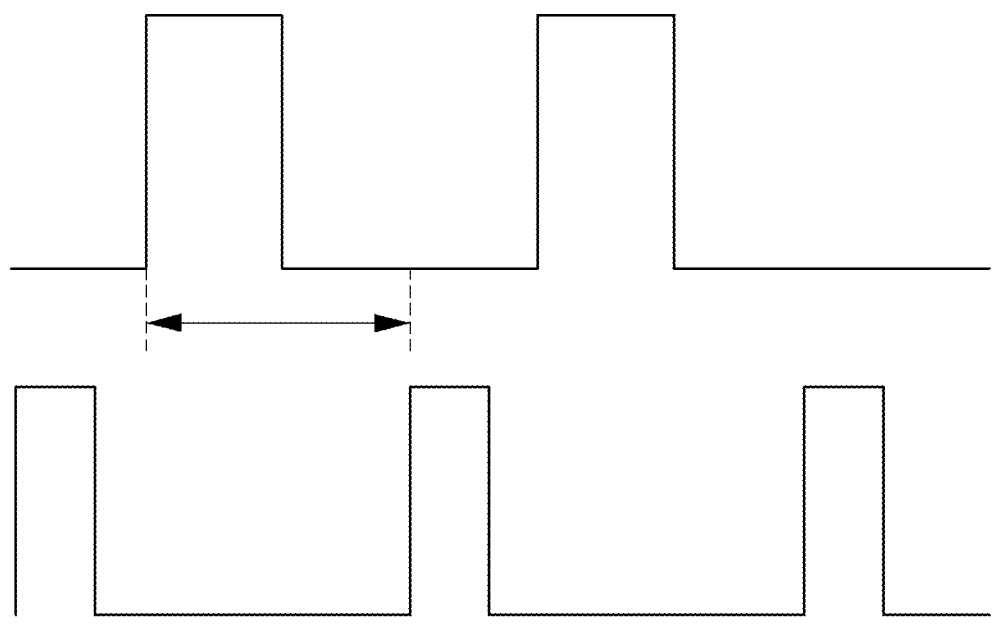
FIG. 5c depicts a graphical representation of a third delay between the end of the pulse of a RF source power signal and the start of a pulse of the RF bias signal in accordance with an embodiment of the present principles.

As described with respect to 406 above, an RF bias signal provided by the bias power supply 150 is applied for biasing the ionized, generated plasma towards the wafer after a delay of the removal of the RF power from the RF power source 162 to a plasma generating element. FIGS. 5a-5c depict non-limiting examples of delays that can be applied between the removal of the RF source power from the RF power source 162 to a plasma generating element and the application of the RF bias signal provided by the bias power supply 150 for biasing the ionized, generated plasma towards the wafer.

Figure 6A:
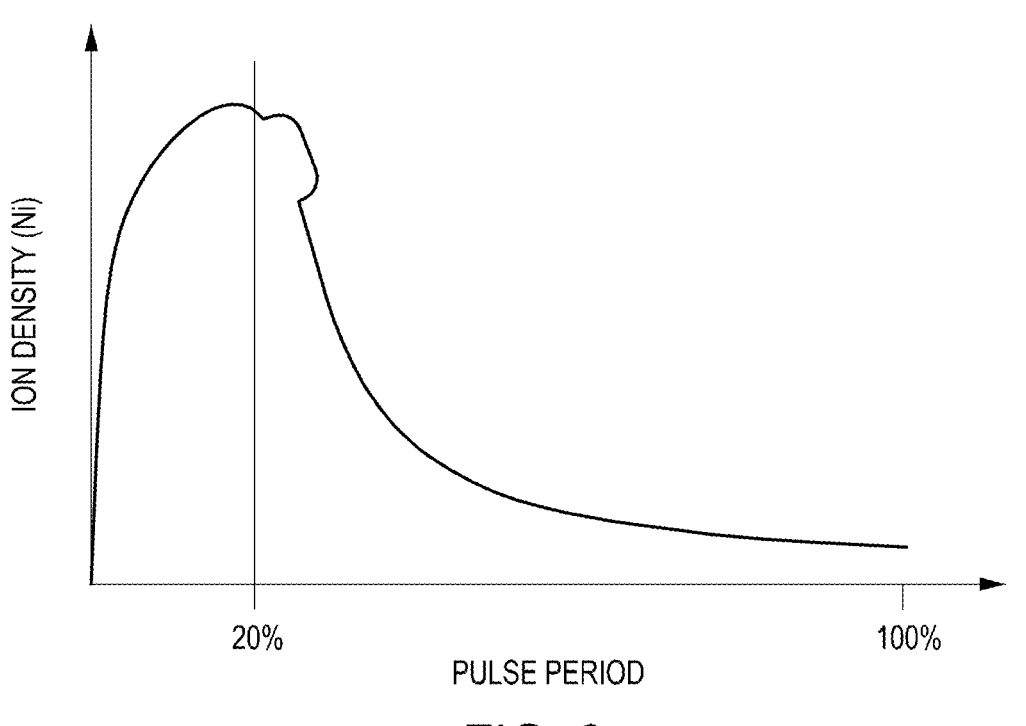
FIG. 6a depicts a graphical representation of a resulting ion density/energy of a generated plasma during a pulse period of the RF source power signal for the pulse arrangement of FIG. 5a in accordance with an embodiment of the present principles.

FIG. 5a depicts a graphical representation of an embodiment of the present principles in which there is a minimal delay between the end of the duty cycle (on time) of the RF source power from the RF power source 162 and a start of the duty cycle (on time) of the RF bias signal. That is, in the embodiment of FIG. 5a the RF bias signal is turned on at a point in time coinciding with 20% of a pulse period of the RF source power from the RF power source 162, which, in the embodiment of FIG. 5a, coincides substantially with a duty cycle of the RF source power from the RF power source 162. As depicted in FIG. 5a, the RF bias signal is turned on at a point substantially as the RF power signal is turned off. FIG. 6a depicts a graphical representation of a resulting ion density of a generated plasma during a pulse period of the RF source power signal for the pulse arrangement of FIG. 5a. As depicted in FIG. 6a, an ion density of a plasma created with the application of the RF source power signal as depicted in 5a begins to decay as the RF bias signal is turned on. Illustratively in FIG. 6a, the bump in the signal represents a time when ions are attracted towards the surface of a wafer for etching. Ion density actively etching a wafer surface begins when the RF bias is applied which is represented by the bump depicted in the graph in FIG. 6a. As depicted in FIG. 6a, ion density in the plasma is maximum when a delay between the time when the RF source power is turned OFF and the time when the RF bias signal is turned ON is minimal.

Figure 6B:
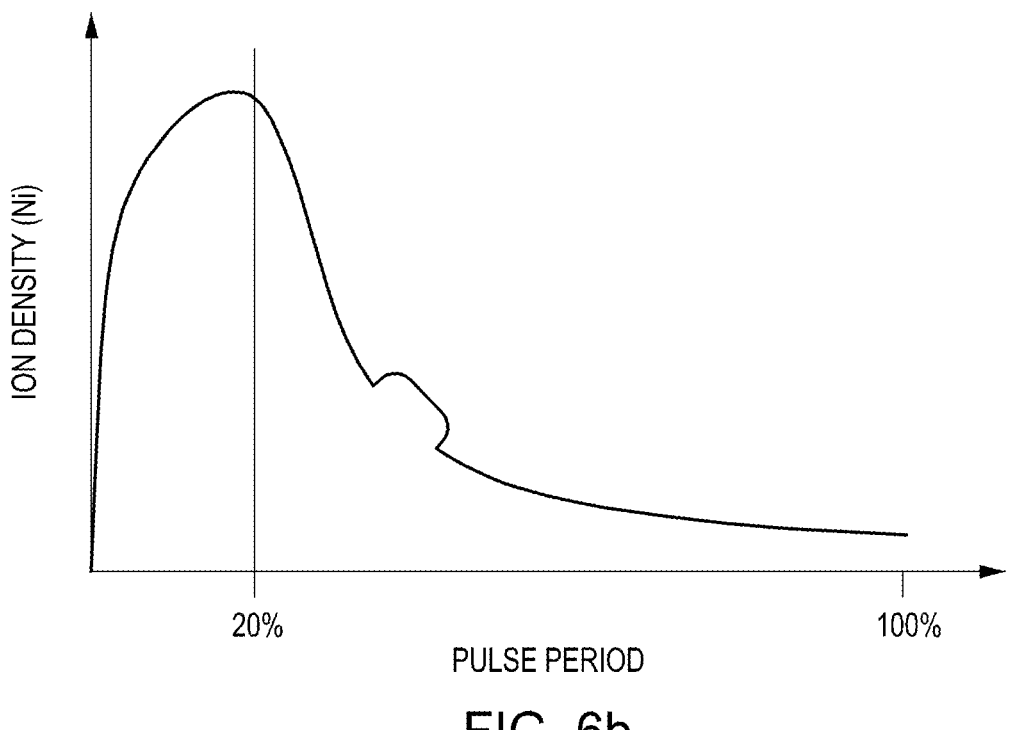
FIG. 6b depicts a graphical representation of a resulting ion density/energy of a generated plasma during a pulse period of the RF source power signal for the pulse arrangement of FIG. 5b in accordance with an embodiment of the present principles.

FIG. 5b depicts a graphical representation of an embodiment of the present principles in which the RF bias signal is turned on at a point in time coinciding with 40% of a pulse period of the RF source power from the RF power source 162. As depicted in FIG. 5b, the RF bias signal is turned on some time after the RF source power signal is turned off (i.e., after the duty cycle of the RF source power). FIG. 6b depicts a graphical representation of a resulting ion density of a generated plasma for the pulse arrangement of FIG. 5b. As depicted in FIG. 6b, an ion density of a plasma created during the application of the RF source power as depicted in FIG. 5b, has decayed significantly by the time the RF bias signal is turned on. Illustratively in FIG. 6b, the bump in the signal again represents a time when ions are attracted towards the surface of a wafer for etching, which represents a time when the RF bias is applied. As depicted in FIG. 6b, ion density in the plasma for the pulse arrangement of FIG. 5b is less than in the pulse arrangement of FIG. 5a.

Figure 6C:
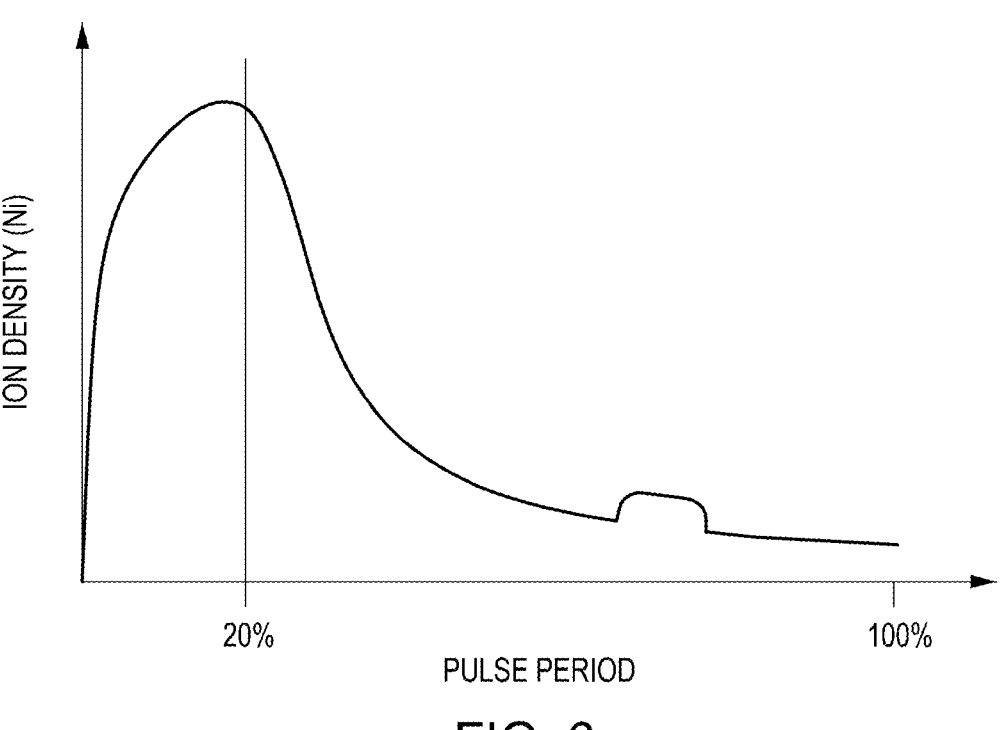
FIG. 6c depicts a graphical representation of a resulting ion density/energy of a generated plasma during a pulse period of the RF source power signal for the pulse arrangement of FIG. 5c in accordance with an embodiment of the present principles.

FIG. 5c depicts a graphical representation of an embodiment of the present principles in which the RF bias signal is turned on at a point in time coinciding with 40% of a pulse period of the RF source power from the RF power source 162. As depicted in FIG. 5c, the RF bias signal is turned on some greater time after the RF source power is turned off (i.e., after the duty cycle of the RF source power) than in FIG. 5b. FIG. 6c depicts a graphical representation of a resulting ion density of a generated plasma for the pulse arrangement of FIG. 5c. As depicted in FIG. 6c, an ion density of a plasma created during the application of the RF source power as depicted in FIG. 5c, has decayed even more significantly than in the embodiment of FIG. 6b by the time the RF bias signal is turned on. Illustratively in FIG. 6c, the bump in the signal again represents a time when ions are attracted towards the surface of a wafer for etching, which represents a time when the RF bias is applied. As depicted in FIG. 6c, ion density in the plasma for the pulse arrangement of FIG. 5c is less than in the pulse arrangement of FIGS. 5a and 5b.

In such embodiments, because neutral density remains substantially constant, the reduction of the ion density/energy in a plasma after an RF source power is no longer being applied results in an increase in the neutral density to ion density ratio of the created plasma.

In accordance with embodiments of the present principles, by providing and controlling a delay between the beginning of an "off time" of RF source power provided for generating a plasma and the beginning of an "on time" for the RF bias signal provided for biasing the ionized, generated plasma towards the wafer, a neutral density to ion density ratio of the generated plasma can be advantageously controlled. Furthermore, in accordance with the present principles, the RF bias power can be independently used to control ion energies reaching the wafer surface. That is, in conventional approaches (i.e., continuous wave, sync pulse and other pulsing schemes) ion energy is dependent on ion densities. In accordance with the present principles, ion density can be controlled by controlling a delay between a source signal used to generate a plasma and a bias signal used to bias the generated plasma towards a wafer.

As described above, by controlling a neutral density to ion density ratio of generated plasma in accordance with the present principles, loading effects due to varying sizes of aspect ratio of features on a surface of a wafer can be improved. That is, by generating a plasma in accordance with the embodiments of the present principles described herein, more uniform etch rates or etch depths for features on a surface of a wafer having different sized aspect ratios can be achieved because of an increase in the neutral density to ion density ratio of the generated plasma.

In addition, by controlling a neutral density to ion density ratio of generated plasma in accordance with embodiments of the present principles, etch selectivity can be controlled. More specifically, different materials on, for example, the surface of a wafer, are etched at different rates depending on a ratio of neutral densities versus ion densities/of a generated plasma. By generating and applying a plasma in accordance with the present principles, the ratio of neutral densities versus ion densities/of a generated plasma can be controlled to provide a desired etching effect for different materials on a surface of a wafer. For example, etching of silicon with a silicon oxide mask is very common in semiconductor fabrication. Achieving high ion density and high ion energy in a plasma in accordance with the present principles increases a silicon oxide etch rate. Alternatively, achieving higher neutral densities in a plasma in accordance with the present principles increases silicon etch rate. Hence, in some embodiments to achieve high selectivity, higher neutral densities compared to ion densities are required. As described above, increasing a delay between an off time of a RF source power and the on time of a bias signal, a neutral density ratio to ion density is increased, which results in higher selectivity.

Figure 7:
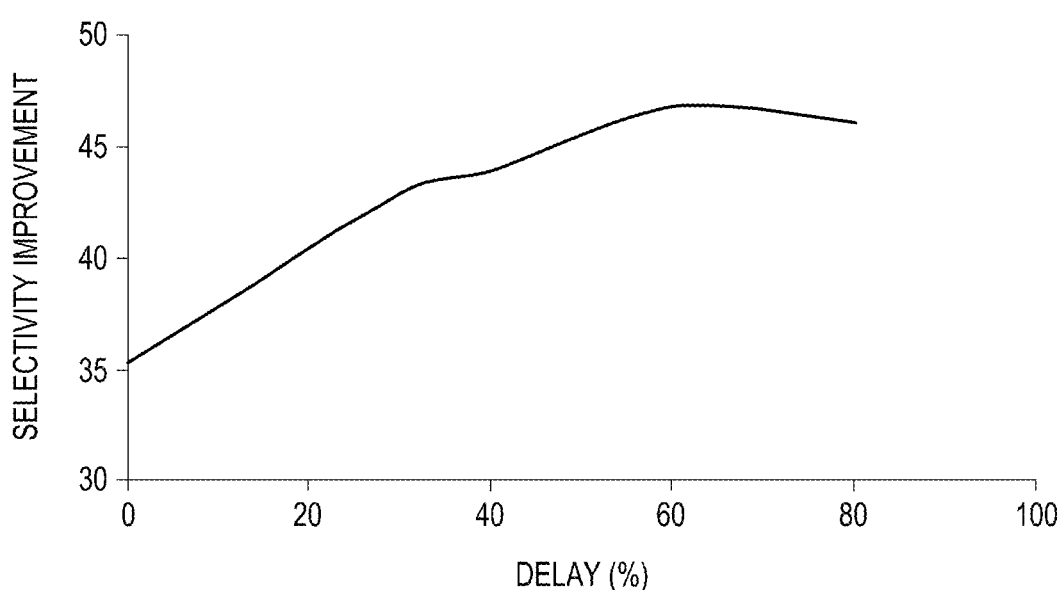
FIG. 7 depicts a graphical representation of an improvement in etching selectivity in response to an increase in a time delay in accordance with an embodiment of the present principles.

For example, FIG. 7 depicts a graphical representation of an improvement in etching selectivity for a silicon wafer having a silicon oxide mask in response to an increase in a neutral density to ion density ratio achieved by increasing a delay between a beginning of an "off time" of RF source power applied to a plasma generating element and an "on time" of a bias signal applied for biasing a generated plasma towards the wafer in accordance with embodiments of the present principles. As depicted in FIG. 7, as a delay time between the "off time" of RF source power applied to a plasma generating element and an "on time" of a bias signal applied for biasing a generated plasma towards the wafer is increased, a neutral density to ion density ratio of a generated plasma is increased and, as such, the silicon is etched at a faster rate than the silicon oxide. More specifically, in the embodiment of FIG. 7, the etch rate of the silicon oxide will reduce at a much faster rate than the etch rate of the silicon because of an increase in a neutral density to ion density ratio achieved by increasing a delay between a beginning of an "off time" of RF source power applied to a plasma generating element and an "on time" of a bias signal applied for biasing a generated plasma towards the wafer in accordance with embodiments of the present principles. In the embodiment of FIG. 7, an increase in delay is measured in a percentage of a total pulse period of the RF source power.

By controlling a time delay between a beginning of an "off time" of RF source power applied to a plasma generating element and an "on time" of a bias signal applied for biasing a generated plasma towards the wafer in accordance with embodiments of the present principles, etch rates of different materials can be advantageously controlled to provide improved selectivity. Although in the embodiment of FIG. 7, an increase in a delay time between a beginning of an "off time" of RF source power applied to a plasma generating element and an "on time" of a bias signal applied for biasing a generated plasma towards the wafer is described to improve selectivity, in other embodiments in accordance with the present principles, a delay time between a beginning of an "off time" of RF source power applied to a plasma generating element and an "on time" of a bias signal applied for biasing a generated plasma towards the wafer can be decreased to provide an improvement to selectivity based on materials that are desired to be etched. In other embodiments, a delay time between a beginning of an "off time" of RF source power applied to a plasma generating element and an "on time" of a bias signal applied for biasing a generated plasma towards the wafer can be altered periodically to provide a desired selectivity result.

Although the above described embodiments of the present principles are described with reference to etching processes, embodiments in accordance with the present principles can be applied to deposition processes and hybrid, etch/deposition processes. For example, some hybrid processes require deposition and etching to be performed in loops. In such embodiments, periods of time during which RF source power is "ON" (i.e., duty cycle of RF source power) can be implemented to deposit a layer of material on a wafer, while periods of time during which a bias signal is "ON" (i.e., duty cycle of bias signal) can be implemented for etching films on the wafer. That is, by implementing a time delay between RF source power "off time" and a bias signal "on time" in accordance with the present principles, deposition off material on a surface of a wafer can be achieved while etching of a bottom hole/trench off a feature on a surface of a wafer can be achieved. Such embodiments of the present principles are particularly beneficial in mask etching processes, in which a mask thickness can be very small and can vary from location to location and, as such, high selectivity etch is needed such that mask thickness can be increased as well as etching of a bottom of a feature on a surface of a wafer.

While the foregoing is directed to embodiments of the present principles, other and further embodiments may be devised without departing from the basic scope thereof. For example, the various devices, modules, etc. described herein can be enabled and operated using hardware circuitry, firmware, software or any combination of hardware, firmware, and software (e.g., embodied in a machine-readable medium).

In addition, the various operations, processes, and methods disclosed herein can be embodied in a machine-readable medium and/or a machine accessible medium/storage device compatible with a data processing system (e.g., a computer system), and can be performed in any order (e.g., including using means for achieving the various operations). Accordingly, the specification and drawings are to be regarded in an illustrative rather than a restrictive sense. In some embodiments, the machine-readable medium can be a non-transitory form of machine-readable medium/storage device.

In the foregoing description, numerous specific details, examples, and scenarios are set forth in order to provide a more thorough understanding of the present principles. However, embodiments of the principles can be practiced without such specific details. Further, such examples and scenarios are provided for illustration, and are not intended to limit the teachings in any way. Those of ordinary skill in the art, with the included descriptions, should be able to implement appropriate functionality without undue experimentation.

References in the specification to "an embodiment," etc., indicate that the embodiment described may include a particular feature, structure, or characteristic, but every embodiment may not necessarily include the particular feature, structure, or characteristic. Such phrases are not necessarily referring to the same embodiment. Further, when a particular feature, structure, or characteristic is described in connection with an embodiment, the feature, structure, or characteristic is believed to be within the knowledge of one skilled in the art to effect such feature, structure, or characteristic in connection with other embodiments whether or not explicitly indicated.

Modules, data structures, blocks, and the like are referred to as such for case of discussion, and are not intended to imply that any specific implementation details are required. For example, any of the described modules and/or data structures can be combined or divided into sub-modules, sub-processes or other units of computer code or data as may be required by a particular design or implementation of the controller 110.

The invention claimed is:

1. An apparatus for controlling processing of a wafer in a plasma chamber system, comprising:
   a processor; and
   a memory coupled to the processor, the memory having stored therein at least one of programs or instructions executable by the processor to configure the apparatus to:
      generate a plasma by applying RF source power to a plasma generating element of the plasma chamber for a first period of time of a pulse period of the RF source power;
      after an expiration of the first period of time, remove the RF source power from the plasma generating element;
      provide a delay after the removal of the RF source power and before an application of an RF bias signal;
      control a length of the delay between the removal of the RF source power and the application of an RF bias signal to control a neutral density to ion density ratio for the plasma for determining a desired etch rate, etch depth, or etch selectivity for features on a surface of the wafer;

after the delay is controlled, apply an RF bias signal to bias the generated plasma towards the wafer for a second period of time during the pulse period of the RF source power; and after an expiration of the second period of time, remove the RF bias signal before a next pulse period of the RF source power.

2. The apparatus of claim 1, wherein a length of the delay between the removal of the RF source power and the application of the RF bias signal is selected to produce a neutral density to ion density ratio that produces a high selectivity etching of different materials on a surface of the wafer during processing.

3. The apparatus of claim 1, wherein a length the delay between the removal of the RF source power and the application of the RF bias signal is selected to produce a neutral density to ion density ratio that reduces aspect ratio-dependent etch of at least one material on a surface of the wafer during processing resulting in improved etch uniformity.

4. The apparatus of claim 1, wherein a deposition process is performed on the wafer during the application of the RF source power to the plasma generating element and an etch process is performed on the wafer during the application of the RF bias signal.

5. The apparatus of claim 1, wherein the RF bias signal is applied to a pedestal of the plasma chamber system used to support the wafer.

6. The apparatus of claim 1, wherein the RF source power and the RF bias signal comprise different duty cycles.

7. The apparatus of claim 1, wherein the first period of time and the second period of time combined do not exceed the pulse period of the RF source power.

8. The apparatus of claim 1, wherein the RF source power is removed from the plasma generating element by turning off a source of the RF source power.

9. The apparatus of claim 1, wherein the RF source power is removed from the plasma generating element by blocking the RF source power from reaching the plasma generating element.

10. The apparatus of claim 1, wherein the RF bias signal is removed by turning off a source of the RF bias signal.

11. A system for controlling processing of a wafer in a plasma chamber system, comprising:

a plasma generating element for the plasma chamber system;

a RF power source; and an apparatus, comprising:

a processor; and a memory coupled to the processor, the memory having stored therein at least one of programs or instructions executable by the processor to configure the apparatus to:

generate a plasma by applying RF power from the RF power source to the plasma generating element of the plasma chamber for a first period of time of a pulse period of the RF source power;

after an expiration of the first period of time, remove the RF source power from the plasma generating element;

provide a delay after the removal of the RF source power and before an application of an RF bias signal;

control a length of the delay between the removal of the RF source power and the application of an RF bias signal to control a neutral density to ion density ratio for the plasma for determining a desired etch rate, etch depth, or etch selectivity for features on a surface of the wafer;

after the delay is controlled, apply an RF bias signal to bias the generated plasma towards the wafer for a second period of time during the pulse period of the RF source power; and after an expiration of the second period of time, remove the RF bias signal before a next pulse period of the RF source power.

12. The system of claim 11, wherein a length of the delay between the removal of the RF source power and the application of the RF bias signal is selected to produce a neutral density to ion density ratio that produces a high selectivity etching of different materials on a surface of the wafer during processing.

13. The system of claim 11, wherein a length the delay between the removal of the RF source power and the application of the RF bias signal is selected to produce a neutral density to ion density ratio that reduces aspect ratio-dependent etch of at least one material on a surface of the wafer during processing resulting in improved etch uniformity.

14. The system of claim 11, wherein a deposition process is performed on the wafer during the application of the RF source power to the plasma generating element and an etch process is performed on the wafer during the application of the RF bias signal.

15. The system of claim 11, wherein the RF bias signal is applied to a pedestal of the plasma chamber system used to support the wafer.

16. The system of claim 11, wherein the RF source power and the RF bias signal comprise different duty cycles.

17. The system of claim 11, wherein the first period of time and the second period of time combined do not exceed the pulse period of the RF source power.

18. The system of claim 11, wherein the RF source power is removed from the plasma generating element by turning off a source of the RF source power.

19. The system of claim 11, wherein the RF source power is removed from the plasma generating element by blocking the RF source power from reaching the plasma generating element.

20. The system of claim 11, wherein the RF bias signal is removed by turning off a source of the RF bias signal.

* * * * *